United States Patent
Liu et al.

(10) Patent No.: US 9,478,344 B2
(45) Date of Patent: Oct. 25, 2016

(54) PHASE LOCKED LOOP INCLUDING A VARAINDUCTOR

(71) Applicant: TAIWAN SEMICONDUCTOR MANUFACTURING COMPANY, LTD., Hsinchu (TW)

(72) Inventors: Yi-Hsuan Liu, Hualien (TW); Hsieh-Hung Hsieh, Taipei (TW); Chewn-Pu Jou, Hsinchu (TW); Fu-Lung Hsueh, Kaohsiung (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 211 days.

(21) Appl. No.: 14/132,301

(22) Filed: Dec. 18, 2013

(65) Prior Publication Data

US 2015/0170816 A1    Jun. 18, 2015

(51) Int. Cl.
| | |
|---|---|
| H01F 21/12 | (2006.01) |
| H01F 27/28 | (2006.01) |
| H01F 27/40 | (2006.01) |
| H03B 5/12 | (2006.01) |
| H03L 7/099 | (2006.01) |

(52) U.S. Cl.
CPC .......... *H01F 21/12* (2013.01); *H01F 27/2804* (2013.01); *H01F 27/40* (2013.01); *H03B 5/1212* (2013.01); *H03B 5/1228* (2013.01); *H03B 5/1256* (2013.01); *H03L 7/099* (2013.01); *H01F 2021/125* (2013.01); *H03B 2201/0216* (2013.01)

(58) Field of Classification Search
CPC ...................................................... H01F 21/12
USPC ........................................................ 327/157
See application file for complete search history.

(56) References Cited

U.S. PATENT DOCUMENTS

| | | | | |
|---|---|---|---|---|
| 5,872,489 | A * | 2/1999 | Chang | H01L 27/0611 257/531 |
| 6,597,248 | B2 * | 7/2003 | Shirai | H03B 5/1228 331/117 FE |
| 6,853,257 | B2 * | 2/2005 | Yonekawa | H03L 7/193 331/117 R |
| 7,132,901 | B2 | 11/2006 | Cojocaru | |
| 7,202,754 | B2 * | 4/2007 | Komurasaki | H03B 5/1847 331/117 R |
| 7,460,001 | B2 | 12/2008 | Jessie | |
| 8,531,250 | B1 * | 9/2013 | Luschas | H03B 5/1228 257/531 |
| 2003/0222726 | A1 | 12/2003 | Yonekawa et al. | |
| 2006/0071732 | A1 * | 4/2006 | Komurasaki | H03B 5/1847 331/167 |
| 2012/0212300 | A1 | 8/2012 | Tang et al. | |
| 2014/0266344 | A1 * | 9/2014 | Liu et al. | H03B 5/1228 327/157 |
| 2015/0170816 | A1 * | 6/2015 | Liu et al. | H01F 21/12 327/157 |

FOREIGN PATENT DOCUMENTS

| | | |
|---|---|---|
| JP | 5125706 | 1/2013 |
| KR | 10-0807132 | 3/2008 |

OTHER PUBLICATIONS

Shiao, Yu-Shao Jerry et al., "A 100-GHz Varactorless CMOS VCO Using Source Degeneration", IEEE 2012, 3 pages.
U.S. Appl. No. 13/837,184, filed Mar. 14, 2013.
Office Action dated Apr. 18, 2016 and English translation from corresponding No. KR 10-2014-0183231.

* cited by examiner

*Primary Examiner* — Ryan Jager
(74) *Attorney, Agent, or Firm* — Hauptman Ham, LLP

(57) ABSTRACT

A varainductor includes a spiral inductor over a substrate, the spiral inductor comprising a ring portion. The varainductor further includes a ground ring over the substrate, the ground ring surrounding at least the ring portion of the spiral inductor and a floating ring over the substrate, the floating ring disposed between the ground ring and the spiral inductor. The varainductor further includes an array of switches, the array of switches is configured to selectively connect the ground ring to the floating ring.

19 Claims, 8 Drawing Sheets

PHASE LOCKED LOOP INCLUDING A VARAINDUCTOR

BACKGROUND

A phase locked loop (PLL) is a control system configured to generate an output signal whose phase is related to a phase of a reference signal. PLLs are used in demodulator systems, tone detectors, and frequency synthesizers. PLLs are also used in digital applications which include a high frequency period signal to synchronize events within a circuit.

PLLs include a voltage controlled oscillator (VCO) configured to adjust a frequency of the output signal based on a control signal. In some instances, the VCO includes a varactor. A varactor is a diode having a variable capacitance. In some instances, a metal-oxide-semiconductor (MOS) varactor is used in the VCO. A transmission-line-based inductor is also included in the VCO for high frequency applications, e.g., millimeter-wave region, in some instances.

A Q factor is a measure of an amount of energy loss relative to the energy stored in a resonator, such as the varactor. As the Q factor decreases, the oscillations in the varactor are damped more quickly.

BRIEF DESCRIPTION OF THE DRAWINGS

One or more embodiments are illustrated by way of example, and not by limitation, in the figures of the accompanying drawings, wherein elements having the same reference numeral designations represent like elements throughout. It is emphasized that, in accordance with standard practice in the industry various features may not be drawn to scale and are used for illustration purposes only. In fact, the dimensions of the various features in the drawings may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are examples and are not intended to be limiting.

Figure 1:
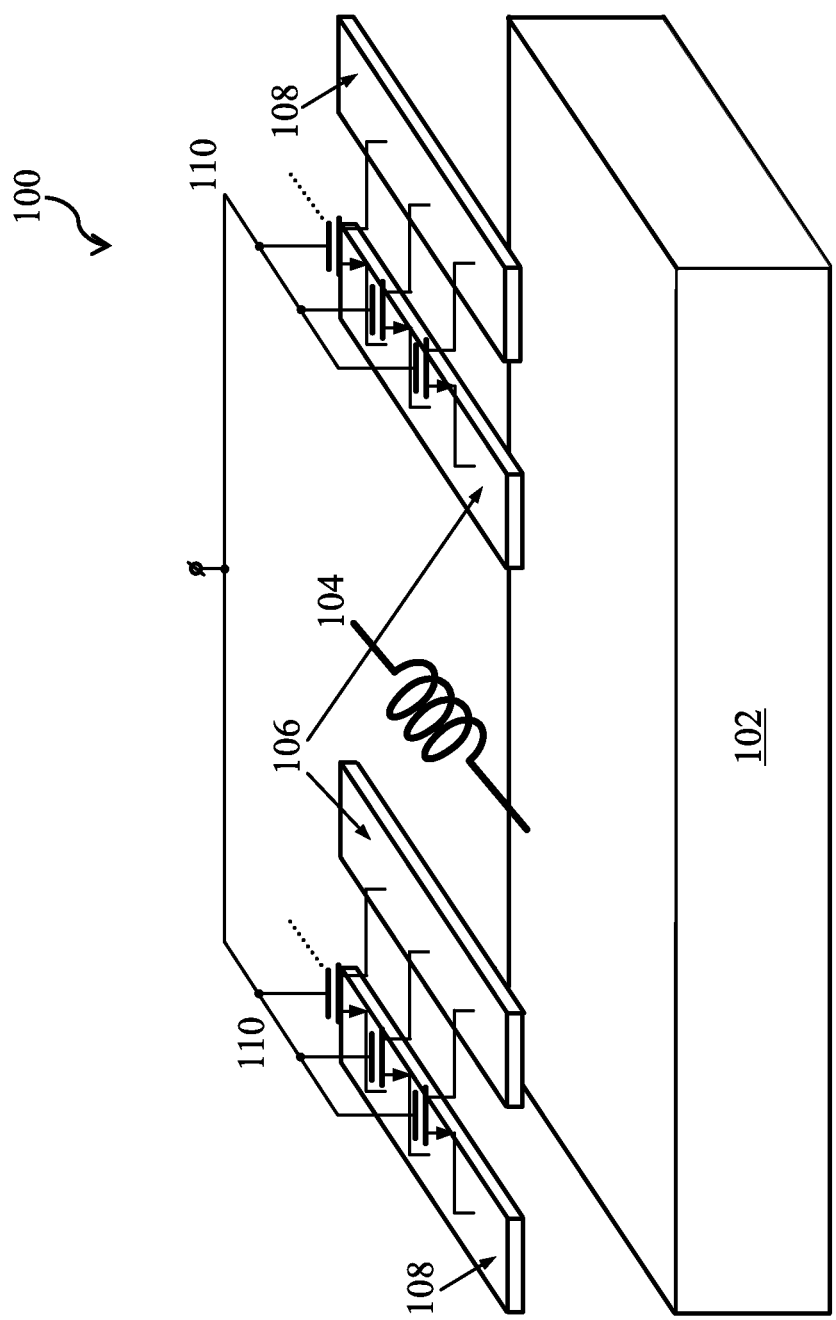
FIG. 1 is a perspective view of a varainductor in accordance with one or more embodiments.

FIG. 1 is a perspective view of a varainductor 100 in accordance with one or more embodiments. Varainductor 100 includes a substrate 102 and a spiral inductor 104 disposed over the substrate. Spiral inductor 104 is configured to receive a DC operating voltage and signal. A floating ring 106 is disposed over substrate 102 and surrounds spiral inductor 104. A ground ring 108 is disposed over substrate 102 and surrounds floating ring 106. Ground ring 108 is configured to receive a ground or reference voltage. Floating ring 106 is positioned between spiral inductor 104 and ground ring 108.

An array of switches 110 is disposed over substrate 102 and is capable of electrically connecting ground ring 108 with floating ring 106. Varainductor 100 is configured to receive a switch control signal Vtune, which is electrically connected to array of switches 110. Switch control signal Vtune controls a level of electrical connectivity between ground ring 108 and floating ring 106, to adjust an inductance level of varainductor 100. A dielectric material (not shown) is disposed between substrate 102, spiral inductor 104, floating ring 106 and ground ring 108.

In some embodiments, substrate 102 comprises an elementary semiconductor including silicon or germanium in crystal, polycrystalline, or an amorphous structure; a compound semiconductor including silicon carbide, gallium arsenic, gallium phosphide, indium phosphide, indium arsenide, and indium antimonide; an alloy semiconductor including SiGe, GaAsP, AlInAs, AlGaAs, GaInAs, GaInP, and GaInAsP; any other suitable material; or combinations thereof. In some embodiments, the alloy semiconductor substrate has a gradient SiGe feature in which the Si and Ge composition change from one ratio at one location to another ratio at another location of the gradient SiGe feature. In some embodiments, the alloy SiGe is formed over a silicon substrate. In some embodiments, substrate 102 is a strained SiGe substrate. In some embodiments, the semiconductor substrate has a semiconductor on insulator structure, such as a silicon on insulator (SOI) structure. In some embodiments, the semiconductor substrate includes a doped epi layer or a buried layer. In some embodiments, the compound semiconductor substrate has a multilayer structure, or the substrate includes a multilayer compound semiconductor structure.

Spiral inductor 104 includes a conductive material. In some embodiments, spiral inductor 104 includes copper, aluminum, tungsten, polysilicon, a conductive polymer, other suitable conductive materials, or combinations therefore. Spiral inductor 104 is configured to receive the DC operating voltage and signal of varainductor 100. In some embodiments, varainductor 100 is used in a voltage controlled oscillator (VCO) of a phase locked loop (PLL). Spiral inductor 104 has a total length. As the total length of spiral inductor 104 increases, a total inductance of varainductor 100 also increases. Spiral inductor 104 has a cross-sectional width. As the cross-sectional width of spiral inductor 104 increases, a characteristic impedance of varainductor 100 decreases. The characteristic impedance is a ratio of a voltage and a current traveling along an inductor. Characteristic impedance is directly related to the total inductance of varainductor 100.

Floating ring 106 includes a conductive material. In some embodiments, floating ring 106 includes copper, aluminum, tungsten, polysilicon, a conductive polymer, other suitable conductive materials, or combinations thereof. In some embodiments, floating ring 106 includes a same material as spiral inductor 104. In some embodiments, floating ring 106 includes a different material from spiral inductor 104. Floating ring 106 has a length surrounding spiral inductor 104. Floating ring 106 has a cross-sectional width. In some embodiments, the cross-sectional width of floating ring 106 is equal to the cross-sectional width of spiral inductor 104. In some embodiments, the cross-sectional width of floating ring 106 is different from the cross-sectional width of spiral inductor 104. As the cross-sectional width of floating ring 106 increases, a grounding capability of varainductor 100 increases, which increases a Q factor of the varainductor. In some instances, if the Q factor is too low, the varactor cannot initiate oscillation in the VCO, which inhibits the PLL from locking the output signal to the reference signal. As a frequency of the reference signal increases, the Q factor of the MOS varactor decreases. This decrease potentially prevents initiation of oscillation in high frequency applications. Floating ring 106 is spaced from spiral inductor 104 by a first spacing distance. In some embodiments, the first spacing distance ranges from about 2 μm to about 50 μm. As the first spacing distance between floating ring 106 and spiral inductor 104 increases, the characteristic impedance of varainductor 100 increases.

Ground ring 108 includes a conductive material. In some embodiments, ground ring 108 includes copper, aluminum, tungsten, polysilicon, a conductive polymer, other suitable conductive materials, or combinations therefore. In some embodiments, ground ring 108 includes a same material as spiral inductor 104 or floating ring 106. In some embodiments, ground ring 108 comprises a different material from spiral inductor 104 or floating ring 106. Ground ring 108 has a length surrounding floating ring 106. Ground ring 108 has a cross-sectional width. In some embodiments, the cross-sectional width of ground ring 108 is the same as the cross-sectional width of spiral inductor 104 or the cross-sectional width of floating ring 106. In some embodiments, the cross-sectional width of ground ring 108 is different from the cross-sectional width of spiral inductor 104 or the cross-sectional width of floating ring 106. As the cross-sectional width of ground ring 108 increases, a grounding capability of varainductor 100 increases, which increases the Q factor of the varainductor. Ground ring 108 is spaced from floating ring 106 by a second spacing distance. In some embodiments, the second spacing distance ranges from about 2 μm to about 50 μm. In some embodiments, the second spacing is uniform around an entire ground ring 108. In some embodiments, the second spacing varies around ground ring 108. As the second spacing distance between floating ring 106 and ground ring 108 increases, a tuning range of varainductor 100 is increased. In some embodiments, the first spacing distance is equal to the second spacing distance. In some embodiments, the first spacing distance is different from the second spacing distance.

Array of switches 110 includes an array of switching elements configured to selectively connect ground ring 108 to a respective floating ring 106. In some embodiments, the switching elements include transistors, thyristors, microelectromechanical systems (MEMS), or other suitable switching elements. Each switch of the array of switches 110 is configured to receive switch control signal Vtune. In some embodiments, array of switches 110 is configured to increase electrical connectivity between floating ring 106 and ground ring 108 as a voltage level of switch control signal Vtune increases. In some embodiments, array of switches 110 is configured to increase electrical connectivity between floating ring 106 and ground ring 108 as the voltage level of switch control signal Vtune decreases. In some embodiments, array of switches 110 is configured to gradually adjust electrical connectivity between floating ring 106 and ground ring 108 as the voltage level of switch control signal Vtune changes. In some embodiments, array of switches 110 is configured to adjust electrical connectivity between floating ring 106 and ground ring 108 in a digital manner as the voltage level of switch control signal Vtune changes.

The dielectric material is disposed between the various elements of varainductor 100. The dielectric material is configured to provide electrical insulation between spiral inductor 104, floating ring 106 and ground ring 108. In some embodiments, the dielectric material is a low-k dielectric material. In some embodiments, the dielectric material has a k value less than 3.5. In some embodiments, the dielectric material has a k value less than 2.5. Suitable low-k dielectric materials include fluorinated silica glass (FSG); carbon doped silicon oxide, BLACK DIAMOND® (Applied Materials of Santa Clara, Calif.), xerogel, aerogel, amorphous fluorinated carbon, parylene, bis-benzocyclobutenes (BCB), SILK® (Dow Chemical, Midland, Mich.), polyimide, porous polymeric materials, other suitable materials or combinations thereof. In some embodiments, the low-k dielectric material reduces tuning problems within varainductor 100. In some embodiments, each of spiral inductor 104, floating ring 106 and ground ring 108 are formed in a same plane in the dielectric material. In some embodiments, at least one of spiral inductor 104, floating ring 106 or ground ring 108 are formed in a different plane in the dielectric layer from at least another of the spiral inductor, the floating ring or the ground ring.

Figure 2:
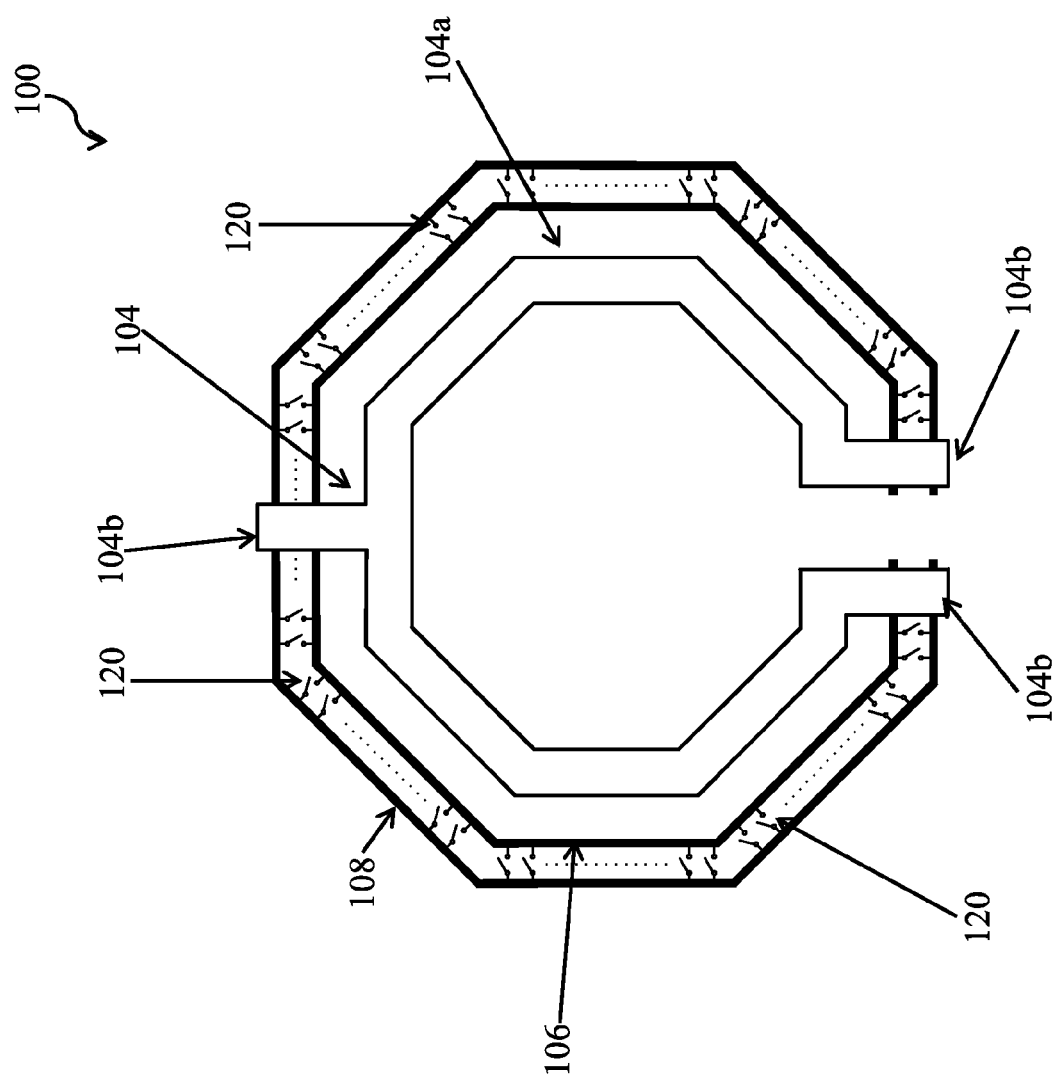
FIG. 2 is a top view of a varainductor in accordance with one or more embodiments.

FIG. 2 is a top view of varainductor 100 in accordance with one or more embodiments. Spiral inductor 104 includes a ring portion 104a, which is surrounded by floating ring 106 and ground ring 108. Spiral inductor 104 also includes ports 104b configured to receive an input signal or output an output signal. Varainductor 100 includes switches 120 between floating ring 106 and ground ring 108. Switches 120 are individual switches from array of switches 110 (FIG. 1). As mentioned above, switches 120 are able to be implemented using a variety of switching elements including transistors, thyristors, MEMS, or other suitable switching elements. In some embodiments, every switch 120 has substantially the same structure. In some embodiments, at least one switch 120 has a different structure than at least one other switch 120. A different structure means a different type of switching element, a different dimension, a different threshold voltage, or another structural difference within the switching elements.

In some embodiments, ring portion 104a of spiral inductor 104 is disposed on multiple levels of the dielectric material. A level of the dielectric layer is defined by a distance from a top surface of substrate 102. For example, a first ring portion of spiral inductor 104 is formed on a first level of the dielectric material, and a second ring portion of spiral inductor 104 is formed on a second level of the dielectric material different from the first level. The first ring portion and the second ring portions are connected by conductive elements, e.g., vias. In some embodiments, the first ring portion and the second ring portions are connected by switching elements, e.g., transistors, to adjust a length of ring portion 104a of spiral inductor 104. In some embodiments, at least one port 104b of spiral inductor 104 is disposed on a different level of the dielectric material from at least a part of ring portion 104a or another port 104b. In some embodiments, all ports 104b and an entirety of ring portion 104a are disposed on a same level of the dielectric material.

In some embodiments, floating ring 106 includes multiple layers disposed on different levels of the dielectric material. In some embodiments, portions of floating ring 106 on different levels of the dielectric material are connected by conductive elements, e.g., vias. In some embodiments, at least a portion of floating ring 106 is disposed on a same level of the dielectric material as ring portion 104a. In some embodiments, floating ring 106 is disposed on a different level of the dielectric material from at least a portion of ring portion 104a.

In some embodiments, ground ring 108 includes multiple layers disposed on different levels of the dielectric material. In some embodiments, portions of ground ring 108 on different levels of the dielectric material are connected by conductive elements, e.g., vias. In some embodiments, at least a portion of ground ring 108 is disposed on a same level of the dielectric material as ring portion 104a or floating ring 106. In some embodiments, ground ring 108 is disposed on a different level of the dielectric material from at least a portion of ring portion 104a or floating ring 106. In some embodiments, ground ring 108 is disposed a different distance from the top surface of substrate 102 with respect to floating ring 106.

In some embodiments, varainductor 100 is part of a monolithic three-dimensional integrated circuit (3DIC). Monolithic 3DIC include multiple tiers of circuitry formed on a single substrate. Tiers are separated by a thin inter-tier layer. In some embodiments, the inter-tier layer includes an inter-layer dielectric (ILD), a semiconductor material, a doped semiconductor material, or another suitable material. In some embodiments, a thickness of the inter-tier layer ranges from about 0.05 μm to about 2 μm. The thickness of the inter-tier layer is significantly less than a thickness of a second substrate used in other 3DIC designs. Elements of varainductor 100 in different tiers of the monolithic 3DIC are electrically connected together using inter-level vias. In comparison with through substrate vias (TSVs) used in other 3DIC designs, inter-level vias have a smaller diameter, which enables higher via density using the monolithic 3DIC structure. In some embodiments, a diameter of the inter-level vias range from about 50 nanometers (nm) to about 400 nm.

In some embodiments, varainductor 100 includes floating ring 106 located in a different tier from ground ring 108. Inter-level vias are used to electrically connect floating ring 106 to ground ring 108 across the inter-tier layer. In some embodiments, at least one switch of array of switches 110 is located in a same tier as floating ring 106. In some embodiments, at least one switch of array of switches 110 is located in a same tier as ground ring 108. In some embodiments, at least a portion of spiral inductor 104 is located on a different tier from at least one of floating ring 106 or ground ring 108.

Using the monolithic 3DIC design provides an advantage of decreasing an overall size of varainductor 100 in comparison with designs which include a different 3DIC arrangement. The monolithic 3DIC design also enables a higher concentration of vias and reduces production costs by using less materials than other 3DIC designs.

In some embodiments, varainductor 100 is part of a complementary metal oxide semiconductor (CMOS) circuit. In a CMOS circuit floating ring 106 and ground ring 108 are in a same tier as spiral inductor 104. In some embodiments, a distance between at least a portion of floating ring 106 and substrate 102 is different from a distance between another portion of the floating ring and the substrate. In some embodiments, a distance between at least a portion of ground ring 108 and substrate 102 is different from a distance between another portion of the ground ring and the substrate. In some embodiments, a distance between at least a portion of spiral inductor 104 and substrate 102 is different from a distance between another portion of the spiral inductor and the substrate.

Each switch 120 is spaced from an adjacent switch by a switch spacing distance. As a resistance between ground ring 108 and floating ring 106 decreases, the tuning range of varainductor 100 increases. A larger switch spacing distance results in fewer switches 120 between floating ring 106 and ground ring 108, which in turn increases the resistance between the ground ring and the floating ring. To maintain a low resistance between ground ring 108 and floating ring 106, switch spacing distance is made as small as design rules and a critical dimension of production capabilities permit to maximize the tuning range of varainductor 100.

Figure 3:
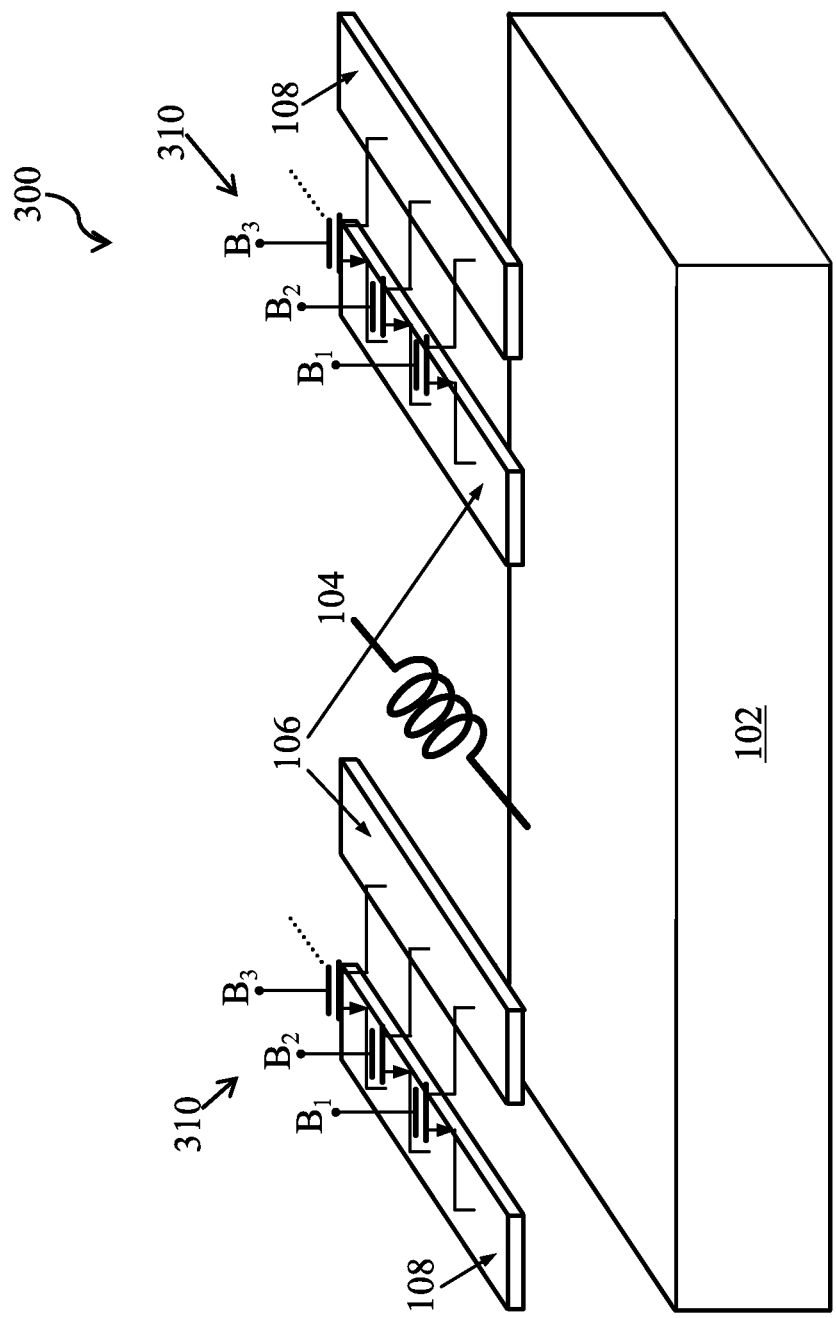
FIG. 3 is a perspective view of a varainductor in accordance with one or more embodiments.

FIG. 3 is a perspective view of a varainductor 300 in accordance with one or more embodiments. Varainductor 300 is similar to varainductor 100, except array of switches 110 is replaced with array of switches 310. Array of switches 310 is configured to facilitate bit control of the switches between floating ring 106 and ground ring 108. In the embodiment of FIG. 3, each switch of array of switches 310 is configured to receive a different control signal to selectively activate/de-activate the switch. In some embodiments, a first group of switches of array of switches 310 is configured to receive a first control signal and a second group of switches of array of switches 310 is configured to receive a second control signal different from the first control signal. In some embodiments, an external circuit is used to generate the individual switch control signals for varainductor 300. In some embodiments, at least one switch of the array of switches 310 has a different voltage drop across the switch than at least another switch of the array of switches.

Bit control of the electrical connection between ground ring 108 and floating ring 106 enables varainductor 300 to have a more finely adjustable capacitance between the ground ring 108 and the floating ring 106 in comparison with varainductor 100. In some embodiments, bit control facilitates more efficient power consumption because the individual switch control signals for each switch of array of switches 310 has a lower power consumption than switch control signal Vtune of varainductor 100.

Figure 4:
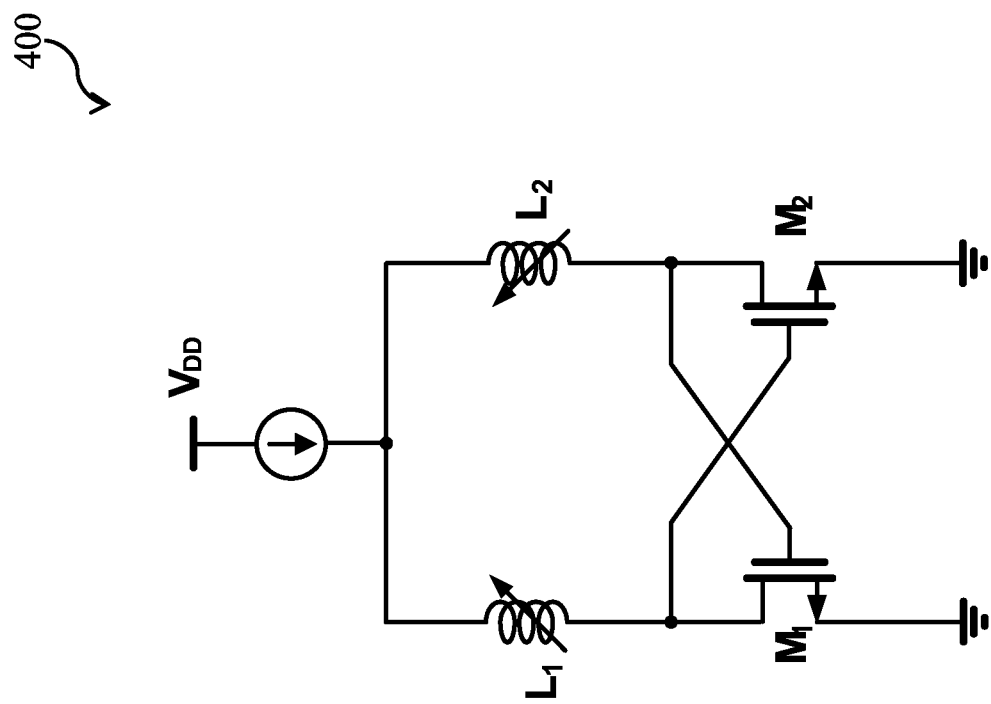
FIG. 4 is a schematic diagram of a voltage controlled oscillator including a varainductor in accordance with one or more embodiments.

FIG. 4 is a schematic diagram of an oscillator circuit 400 including a varainductor in accordance with one or more embodiments. Oscillator circuit 400 includes a first varainductor 402 configured to receive a DC operating voltage and provide inductance for signal oscillation. Oscillator circuit 400 further includes a second varainductor 404 configured to receive a DC operating voltage and provide inductance for signal oscillation. First varainductor 402 is electrically connected in parallel to second varainductor 404. A current source is disposed between first varainductor 402 and the operating voltage VDD and between second varainductor 404 and the operating voltage VDD. First varainductor 402 is connected in series with a first transistor 406. A first terminal of first transistor 406 is connected to first varainductor 402 and a second terminal of first transistor 406 is connected to a reference voltage, e.g. ground. Second varainductor 404 is connected in series with a second transistor 408. A first terminal of second transistor 408 is connected to second varainductor 404 and a second terminal of second transistor 408 is connected to the reference voltage. A gate of first transistor 406 is connected to a first output node A between second varainductor 404 and second transistor 408. A gate of second transistor 408 is connected to a second output node B between first varainductor 402 and first transistor 406. In some embodiments where first varainductor 402 and second varainductor 404 have a structure of varainductor 100 (FIG. 1), oscillator circuit 400 is a voltage controlled oscillator (VCO). In some embodiments where varainductors 402 and 404 have a structure of varainductor 300 (FIG. 3), oscillator circuit 400 is a digitally controlled oscillator (DCO)

In some embodiments, first varainductor 402 includes varainductor 100 (FIG. 1). In some embodiments, first varainductor 402 includes a varainductor other than varainductor 100, such as varainductor 300 (FIG. 3), or another suitable varainductor. In some embodiments, second varainductor 404 includes varainductor 100. In some embodiment, second varainductor 404 includes a varainductor other than varainductor 100, such as varainductor 300 or another suitable varainductor. In some embodiments, first varainductor 402 has a different structure from second varainductor 404.

In some embodiments, first transistor 406 and second transistor 408 are independently selected from p-type metal-oxide-semiconductor (PMOS) transistors, n-type metal-oxide-semiconductor (NMOS) transistors, or other suitable transistors.

Figure 5:
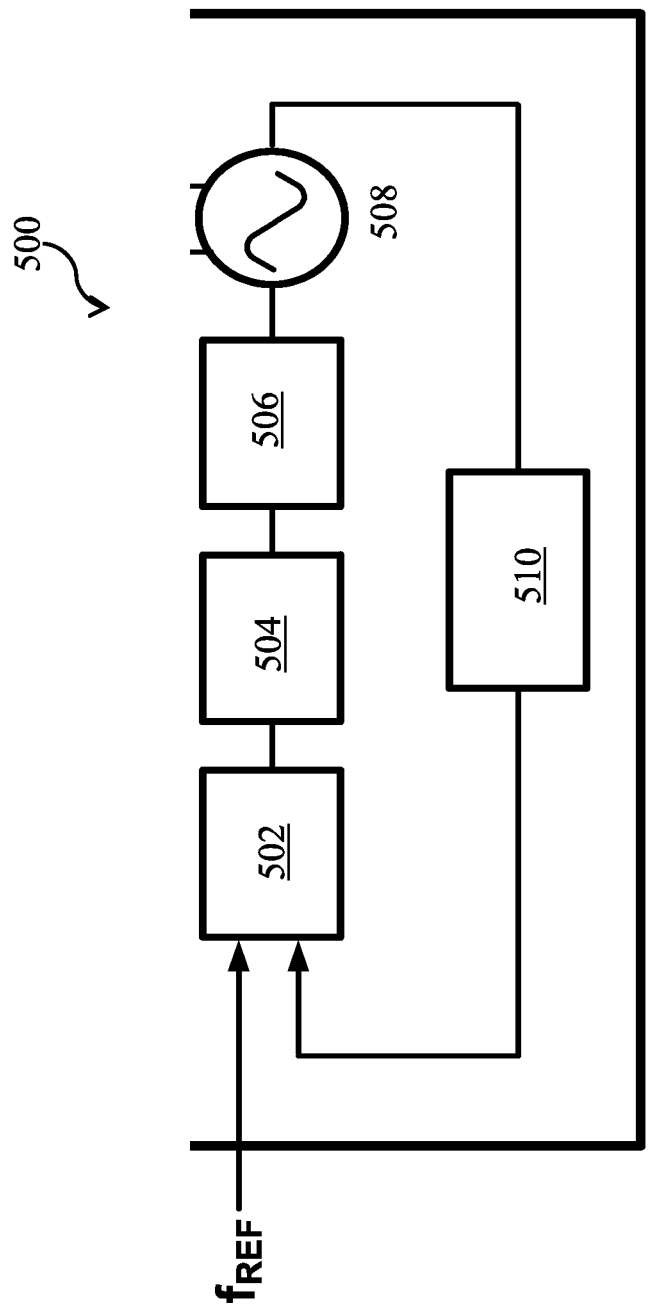
FIG. 5 is a schematic functional diagram of a phase locked loop including a varainductor in accordance with one or more embodiments.

FIG. 5 is a schematic functional diagram of a phase locked loop (PLL) 500 including a varainductor in accordance with one or more embodiments. PLL 500 includes a phase frequency detector (PFD) 502 configured to receive a reference frequency $f_{REF}$ and a feedback frequency $f_{FBK}$. PFD 502 is configured to determine a difference between reference frequency $f_{REF}$ and feedback frequency $f_{FBK}$, and output a first control signal. PLL 500 further includes a charge pump (CP) 504 configured to receive the first control signal. CP 504 is configured to convert the first control signal to an analog voltage signal and output the analog voltage signal. PLL 500 further includes a low pass filter (LPF) 506 configured to receive the analog voltage signal. LPF 506 is configured to remove high frequency components of the analog voltage signal and output a second control signal. PLL 500 further includes an oscillator circuit 508 configured to receive the second control signal. Oscillator circuit 508 is configured to output an output signal LO. Based on the second control signal, oscillator circuit 508 increases or decreases a frequency of the output signal. PLL 500 further includes a feedback frequency divider (FD) 510 configured to receive the output signal. FD 510 is configured to generate feedback frequency $f_{FBK}$, which is a multiple of reference frequency $f_{REF}$.

Oscillator circuit 508 includes a varainductor. In some embodiments, oscillator circuit 508 includes varainductor 100 (FIG. 1), varainductor 300 (FIG. 3) or another suitable varainductor. In some embodiments, oscillator circuit 508 has a structure similar to oscillator circuit 400 (FIG. 4). In some embodiments, the second control signal is the switch control signal Vtune. In some embodiments, the second control signal is received by another circuit configured to generate individual switch control signals for bit control of the varainductor similar to varainductor 300. In some embodiments, oscillator circuit is a VCO. In some embodiments, oscillator circuit 508 is a DCO.

In some embodiments where PLL 500 is included in a receiver device and output signal LO is mixed with a received signal prior to transmission to external circuitry. In some embodiments, the received signal is amplified, e.g., by a low noise amplifier (LNA) prior to mixing with the output signal LO. The mixed output signal is transmitted to other circuits within the receiver device.

Figure 6:
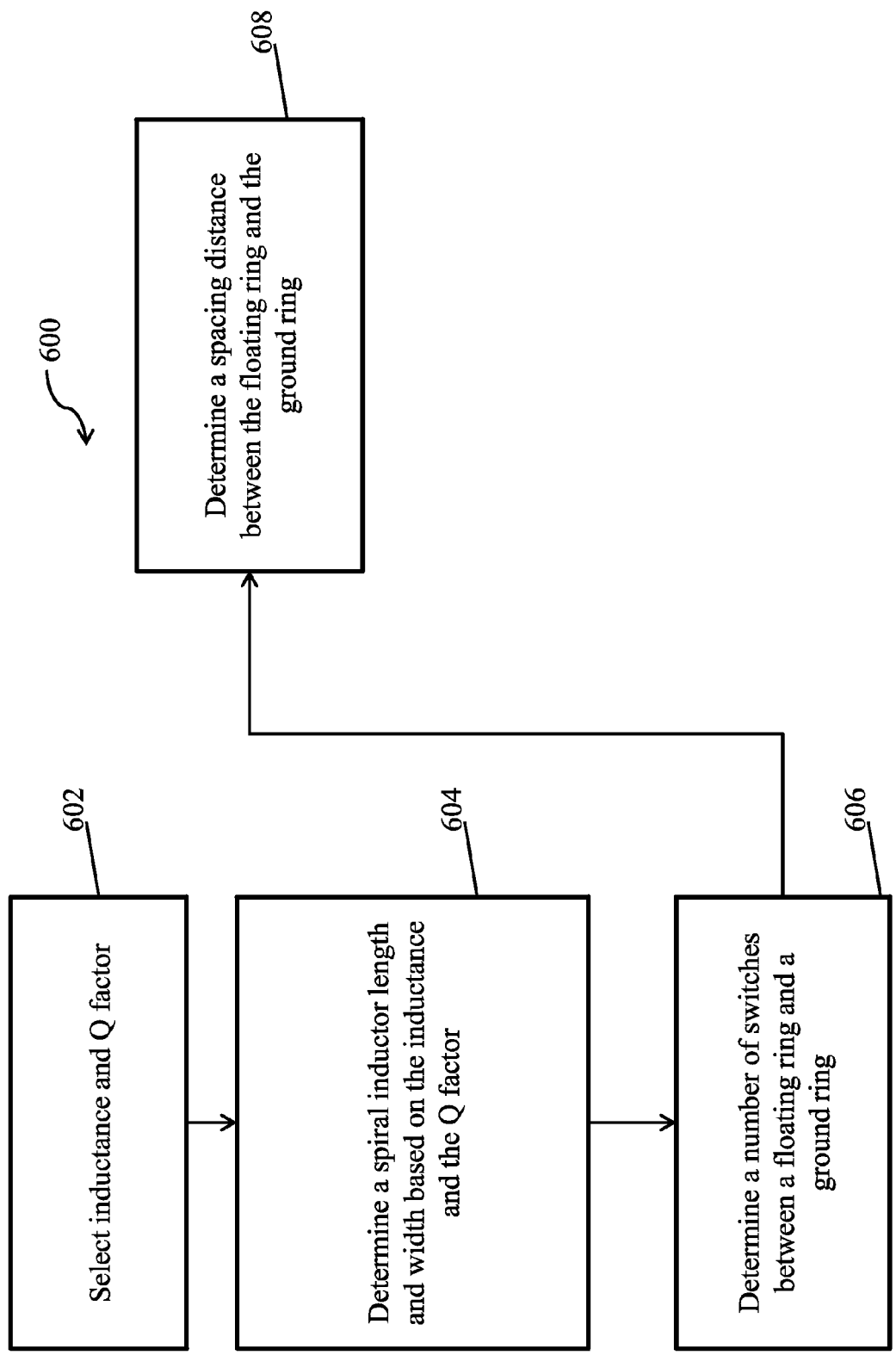
FIG. 6 is a flow chart for a method of designing a varainductor in accordance with one or more embodiments.

FIG. 6 is a flow chart for method 600 of designing a varainductor in accordance with one or more embodiments. In operation 602, an inductance and a Q factor for the varainductor are selected. The inductance and Q factor are determined based on a device into which the varainductor is incorporated. In some embodiments, the inductance and the Q factor are selected using a computer simulation performed by a computer with a processor. As a range of frequencies which the device is configured to receive increases, a higher Q factor is selected to enable initiation of oscillation within the varainductor. Similarly, as the range of frequencies increases, a lower inductance of the varainductor is selected.

In operation 604, a length and a width of a spiral inductor are determined. The parameters are determined based on the inductance and Q factor of the varainductor selected in operation 602. In some embodiments, the length and width are determined using a computer simulation performed by a computer with a processor. The relationship between the various parameters and the inductance and Q factor are described in detail above.

In operation 606, a number of switches between the floating ring and the ground ring is determined. The number of switches is determined based on a critical dimension of a manufacturing process used to form the varainductor. In some embodiments, a number of switches is determined using a computer simulation performed by a computer with a processor. In some embodiments, the number of switches is the maximum number of switches which can be formed along the length of the floating plane based on the manufacturing process. As the number of switches increases, a tuning range of the varainductor increases; however, manufacturing of the varainductor becomes more complex and expensive.

In operation 608, a spacing distance between the floating ring and the ground ring is determined. The spacing distance between the floating ring and the ground ring is determined based on the desired tuning range during operation of the varainductor. In some embodiments, the spacing is determined using a computer simulation performed by a computer with a processor. As the spacing distance increases, the tuning range increases; however, an area of the varainductor also increases.

Figure 7:
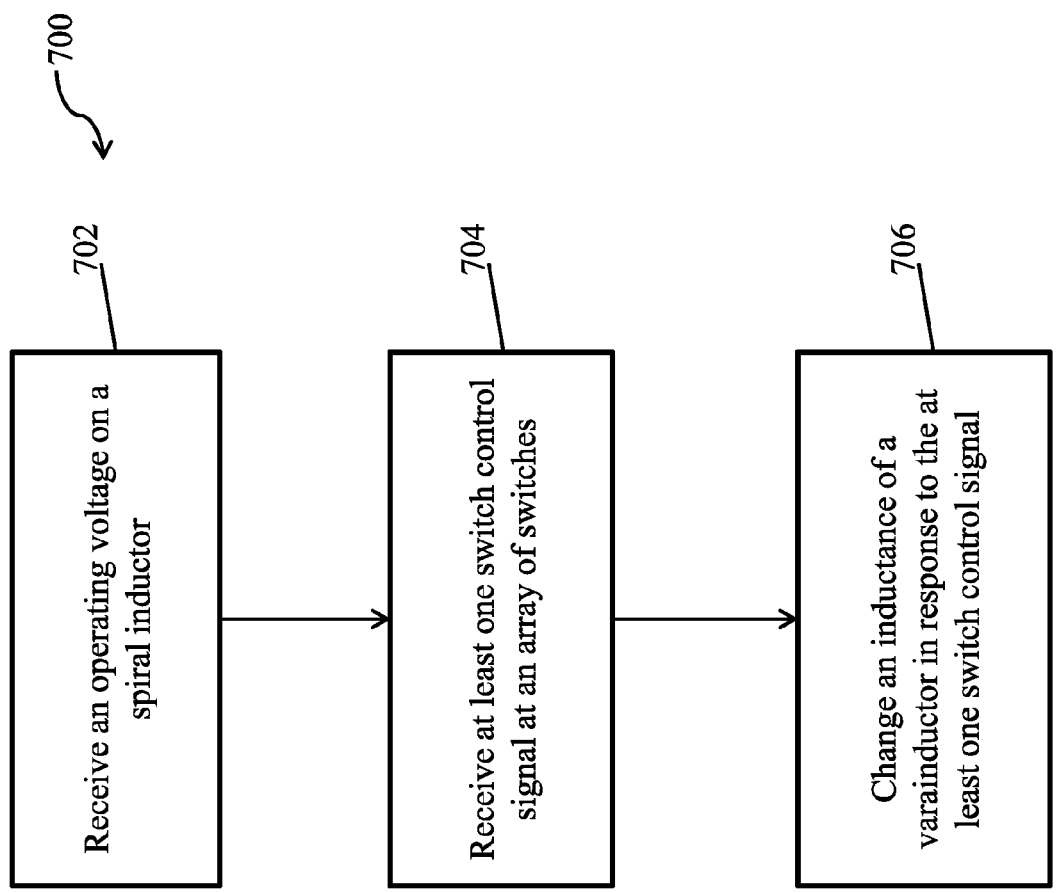
FIG. 7 is a flow chart for a method of operating a varainductor in accordance with one or more embodiments.

FIG. 7 is a flow chart for a method 700 of operating a varainductor in accordance with one or more embodiments. In operation 702, a spiral inductor receives an operating voltage. In some embodiments, the operating voltage is VDD.

In operation 704, an array of switches receives at least one switch control signal. In some embodiments, each switch in the array of switches receives a same switch control signal. In some embodiments, at least one switch in the array of switches receives a different switch control signal from at least another switch in the array of switches. In some embodiments, each switch receives a different switch control signal than every other switch in the array of switches. In some embodiments, the switches of the array of switches are configured to close, i.e., become electrically conductive, in response to a logically high signal. In some embodiments, the switches of the array of switches are configured to open, i.e. become electrically non-conductive, in response to a logically low signal.

In some embodiments, the at least one switch control signal is the second control signal from LPF 506 (FIG. 5). In some embodiments, the at least one switch control signal is a plurality of switch control signals to enable bit control of the switch array. In some embodiments, the plurality of switch control signals is generated by an external circuit configured to receive the second control signal from LPF 506.

In operation 706, an inductance of the varainductor changes in response to the at least one switch control signal. In some embodiments where a number of closed switches increases in response to the at least one switch control signal, the inductance of the varainductor increases. In some embodiments where a number of closed switches decreases in response to the at least one switch control signal, the inductance of the varainductor decreases. In some embodiments where the varainductor in part of an oscillator circuit, an oscillation frequency of the oscillator circuit is configured to increase as the inductance of the varainductor decreases. In some embodiments where the varainductor is part of an oscillator circuit, the oscillation frequency of the oscillator circuit is configured to decrease as the inductance of the varainductor increases.

Figure 8:
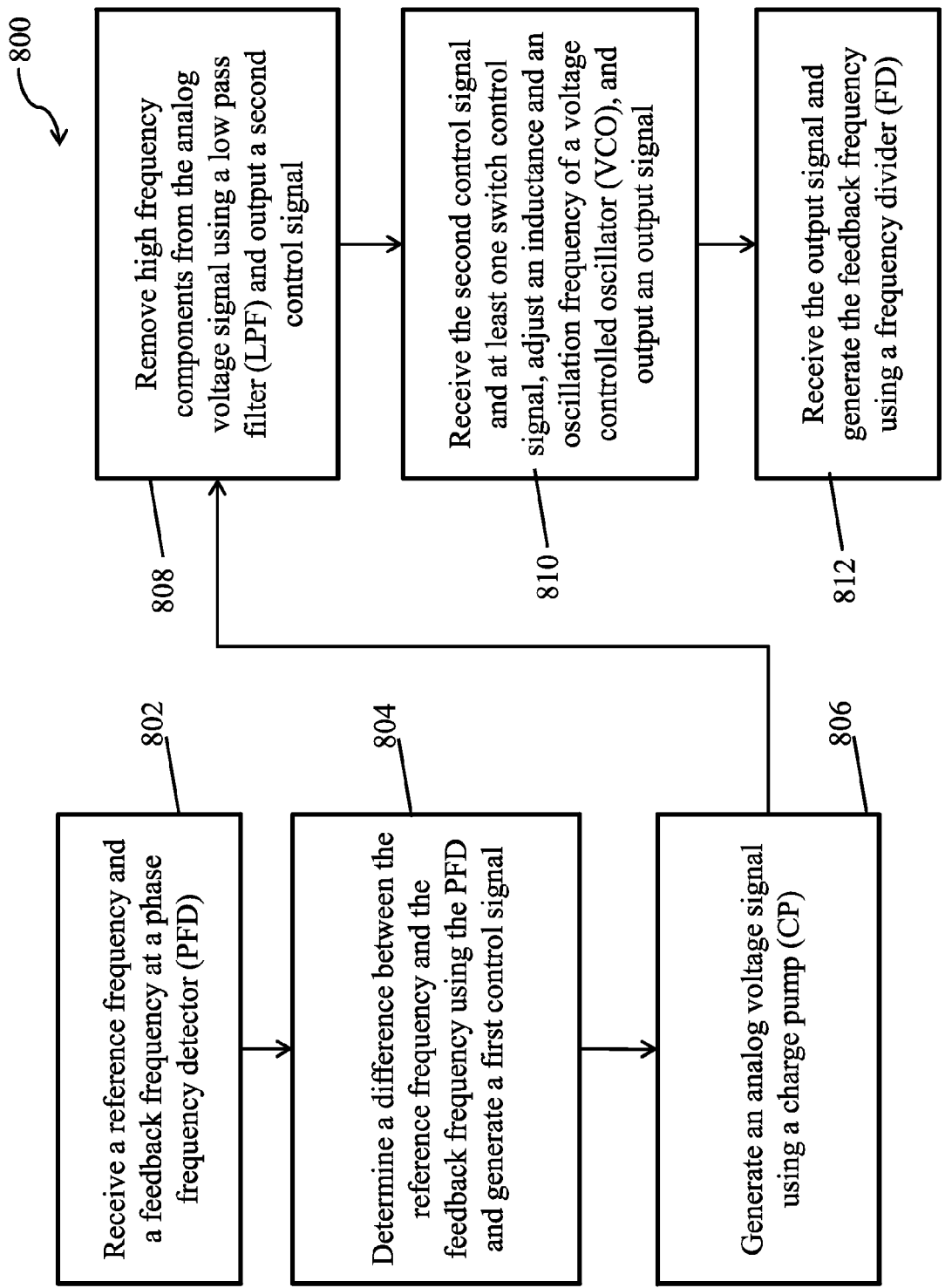
FIG. 8 is a flow chart for a method of operating a phase locked loop including a varainductor in accordance with one or more embodiments.

FIG. 8 is a flow chart for a method 800 of operating a varainductor in accordance with one or more embodiments. In operation 802, a PFD receives a reference frequency. In operation 804, the PFD determines a difference between the reference frequency and a feedback frequency and generates a first control signal. In some embodiments, the first control signal indicates whether an oscillator circuit should increase or decrease frequency oscillation.

In operation 806, a CP generates an analog voltage signal based on the first control signal.

In operation 808, a LPF removes high frequency components from the analog voltage signal and outputs a second control signal.

In operation 810, an oscillator circuit receives the second control signal and at least one switch control signal and adjusts an oscillation frequency of the oscillator circuit. The at least one switch control signal selectively connects a floating plane of a varainductor in the oscillator circuit to a ground plane of the varainductor. In some embodiments where a number of closed switches increases in response to the at least one switch control signal, the inductance of the varainductor increases and an oscillation frequency of the oscillator circuit decreases. In some embodiments where a number of closed switches decreases in response to the at least one switch control signal, the inductance of the varainductor decreases and the oscillation frequency of the oscillator circuit increases. In some embodiments, the at least one switch control signal is the second control signal from operation 808. In some embodiments, the at least one switch control signal is generated by an additional controller circuit configured to receive the second control signal and output the at least one switch control signal. In some embodiments, the at least one switch control signal is configured to be a plurality of switch control signals for bit control the electrical connection between the floating plane and the ground plane.

In operation 812, a FD receives a portion of the output signal and generates the feedback frequency. The feedback frequency is received by the PFD.

One aspect of this description relates to a varainductor. The varainductor includes a spiral inductor over a substrate, the spiral inductor comprising a ring portion. The varainductor further includes a ground ring over the substrate, the ground ring surrounding at least the ring portion of the spiral inductor and a floating ring over the substrate, the floating ring disposed between the ground ring and the spiral inductor. The varainductor further includes an array of switches, the array of switches is configured to selectively connect the ground ring to the floating ring.

Another aspect of this description relates to an oscillator circuit. The oscillator circuit includes a first varainductor configured to receive an operating voltage and a second varainductor configured to receive the operating voltage, wherein the second varainductor is electrically connected in parallel with the first varainductor. The oscillator circuit further includes a first transistor having a first terminal connected to the first varainductor and a second transistor having a first terminal connected to the second varainductor. At least one of the first varainductor or the second varainductor include a spiral inductor.

Still another aspect of this description relates to a phase locked loop (PLL). The PLL includes a phase frequency detector (PFD) configured to receive a reference frequency and a feedback frequency, the PFD configured to generate a first control signal. The PLL further includes a charge pump (CP) configured to receive the first control signal and generate an analog voltage signal and a low pass filter (LPF) configured to receive the analog voltage signal and generate a second control signal. The PLL further includes an oscillator circuit configured to receive the second control signal and generate and output signal. The oscillator circuit includes a first varainductor configured to receive an operating voltage and a second varainductor configured to receive the operating voltage, wherein the second varainductor is electrically connected in parallel with the first varainductor. The oscillator circuit further includes a first transistor having a first terminal connected to the first varainductor and a second transistor having a first terminal connected to the second varainductor. At least one of the first varainductor or the second varainductor includes a spiral inductor. The PLL further includes a frequency divider (FD) configured to receive the output signal and generate the feedback frequency.

It will be readily seen by one of ordinary skill in the art that the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. A phase locked loop (PLL) comprising:
   a phase frequency detector (PFD) configured to receive a reference frequency and a feedback frequency, the PFD configured to generate a first control signal;
   a charge pump (CP) configured to receive the first control signal and generate an analog voltage signal;
   a low pass filter (LPF) configured to receive the analog voltage signal and generate a second control signal;
   an oscillator circuit configured to receive the second control signal and generate an output signal, the oscillator circuit comprising:
   a first varainductor configured to receive an operating voltage;
   a second varainductor configured to receive the operating voltage, wherein the second varainductor is electrically connected in parallel with the first varainductor;
   a first transistor electrically connected to the first varainductor; and
   a second transistor electrically connected to the second varainductor, wherein the first varainductor comprises:
a spiral inductor having a spiral inductor first terminal and a spiral inductor second terminal, wherein the spiral inductor first terminal is an input terminal of the first varainductor, and the spiral inductor second terminal is an output terminal of the first varainductor,
a ground ring surrounding at least a ring portion of the spiral inductor, and
a floating ring disposed between the ground ring and the spiral inductor,
wherein an inductance level of the first varainductor is based on a mutual capacitance between the spiral inductor and the floating ring and a mutual capacitance between the floating ring and the ground ring; and
a frequency divider (FD) configured to receive the output signal and generate the feedback frequency.

2. The PLL of claim 1 further comprising an array of switches, the array of switches is configured to selectively electrically connect the ground ring to the floating ring.

3. The PLL of claim 2, wherein the floating ring is located in a first tier of a monolithic three-dimensional integrated circuit (3DIC), the ground ring is located in a second tier of the monolithic 3DIC different from the first tier, and the floating ring is configured to be selectively electrically connected to the ground ring through at least one inter-tier via.

4. The PLL of claim 2 wherein the array of switches is configured to receive bit control signals and selectively electrically connect the ground ring to the floating ring based on the bit control signals.

5. The PLL of claim 4 wherein each switch of the array of switches receives a respective bit control signal.

6. The PLL of claim 1 further comprising a substrate, wherein the ground ring and the floating ring are disposed over the substrate.

7. A phase locked loop (PLL) comprising:
a phase frequency detector (PFD);
a charge pump (CP) electrically connected to the PFD;
a low pass filter (LPF) electrically connected to the CP and configured to generate a control signal; and
an oscillator circuit electrically connected to the LPF and configured to receive the control signal and generate an output signal, the oscillator circuit comprising:
a first varainductor,
a second varainductor electrically connected in parallel with the first varainductor, wherein the first varainductor comprises:
a spiral inductor having a spiral inductor first terminal and a spiral inductor second terminal, wherein the spiral inductor first terminal is an input terminal of the first varainductor, and the spiral inductor second terminal is an output terminal of the first varainductor, and wherein the output terminal of the first varainductor is an input terminal of the oscillator circuit, and
a floating ring surrounding at least a ring portion of the spiral inductor, and
a monolithic three-dimensional integrated circuit (3DIC) comprising:
a ground ring disposed in a first tier, and
a second tier, wherein the spiral inductor first terminal and the spiral inductor second terminal are disposed in the second tier, the floating ring is disposed in the second tier and is configured to be selectively electrically connected to the ground ring through at least one inter-tier via, wherein an inductance level of the first varainductor is based on a mutual capacitance between the spiral inductor and the floating ring and a mutual capacitance between the floating ring and the ground ring.

8. The PLL of claim 7 further comprising an array of switches, the array of switches configured to selectively electrically connect the ground ring to the floating ring.

9. The PLL of claim 8 wherein each switch of the array of switches receives a respective bit control signal and selectively electrically connects the ground ring to the floating ring based on the respective bit control signal.

10. The PLL of claim 9 wherein the array of switches is configured to gradually adjust electrical connectivity between the ground ring and the floating ring.

11. The PLL of claim 7 further comprising a frequency divider electrically connected to an input terminal of the PFD and configured to receive the output signal and output a feedback frequency to the input terminal of the PFD.

12. The PLL of claim 11 wherein the PFD is configured to receive a reference frequency and the feedback frequency and generate a first control signal.

13. A phase locked loop (PLL) comprising:
a frequency divider configured to receive a PLL output signal and generate a feedback frequency;
a phase frequency detector configured to receive the feedback frequency; and
an oscillator circuit comprising a varainductor, the oscillator circuit electrically connected to the phase frequency detector and configured to generate the PLL output signal, wherein
the varainductor comprises:
a spiral inductor over a substrate, the spiral inductor comprising a ring portion, and wherein an output terminal of the varainductor is an output terminal of the spiral inductor, and wherein the output terminal of the varainductor is electrically connected to an input terminal of the oscillator circuit,
a ground ring over the substrate, the ground ring surrounding at least the ring portion of the spiral inductor,
a floating ring over the substrate, the floating ring disposed between the ground ring and the spiral inductor, and
an array of switches, the array of switches configured to selectively electrically connect the ground ring to the floating ring, wherein
an inductance level of the varainductor is based on a mutual capacitance between the spiral inductor and the floating ring and a mutual capacitance between the floating ring and the ground ring.

14. The PLL of claim 13, wherein each switch of the array of switches is configured to receive a same switch control signal.

15. The PLL of claim 13, wherein at least one switch of the array of switches is configured to receive a different switch control signal from at least another switch of the array of switches.

16. The PLL of claim 13 wherein the floating ring is located in a first tier of a monolithic three-dimensional integrated circuit (3DIC), the ground ring is located in a second tier of the monolithic 3DIC different from the first tier, and the floating ring is configured to be selectively electrically connected to the ground ring through at least one inter-tier via.

17. The PLL of claim 13, wherein the spiral inductor includes a first portion located a first distance from a top surface of the substrate, and a second portion located a second distance from the top surface of the substrate, and the first distance is different from the second distance.

18. The PLL of claim 13, wherein at least one portion of the spiral inductor is located in a first tier of a monolithic three-dimensional integrated circuit (3DIC), and at least one of the floating ring or the ground ring is located in a second tier of the monolithic 3DIC different from the first tier.

19. The PLL of claim 13, wherein the array of switches includes at least one transistor, the at least one transistor configured to selectively electrically connect the floating ring located in a first tier of a monolithic three-dimensional integrated circuit (3DIC) to the ground ring located in a second tier of the monolithic 3DIC different from the first tier, and the at least one transistor is configured to selectively electrically connect the floating ring to the ground ring through an inter-tier via.

* * * * *